(12) United States Patent
Bowen et al.

(10) Patent No.: US 9,379,317 B2
(45) Date of Patent: Jun. 28, 2016

(54) SPIN-POLARISED CURRENT SOURCE

(71) Applicants: CENTRE NATIONAL DE LA RECHERCHE SCIENTIFIQUE, Paris (FR); UNIVERSITE DE STRASBOURG, Strasbourg (FR)

(72) Inventors: Martin Bowen, Kehl (DE); Wolfgang Weber, Kehl (DE); Loïc Joly, Oberhausbergen (FR); Eric Beaurepaire, Vendenheim (FR); Fabrice Scheurer, Vendenheim (FR); Samy Boukari, Horbourg-Wihr (FR); Mébarek Alouani, Wolfisheim (FR)

(73) Assignees: Centre National de la Recherche Scientifique, Paris (FR); Universite de Strasbourg, Strasbourg (FR)

( * ) Notice: Subject to any disclaimer, the term of this patent is extended or adjusted under 35 U.S.C. 154(b) by 8 days.

(21) Appl. No.: 14/395,035

(22) PCT Filed: Apr. 15, 2013

(86) PCT No.: PCT/EP2013/057804
§ 371 (c)(1),
(2) Date: Oct. 16, 2014

(87) PCT Pub. No.: WO2013/156441
PCT Pub. Date: Oct. 24, 2013

(65) Prior Publication Data
US 2015/0129994 A1 May 14, 2015

(30) Foreign Application Priority Data

Apr. 18, 2012 (FR) ...................................... 12 53564

(51) Int. Cl.
*H01L 29/82* (2006.01)
*H01L 33/00* (2010.01)
(Continued)

(52) U.S. Cl.
CPC ............... *H01L 43/12* (2013.01); *H01F 10/005* (2013.01); *H01F 10/3254* (2013.01); *H01F 41/32* (2013.01); *H01L 43/10* (2013.01); *H01F 1/0009* (2013.01)

(58) Field of Classification Search
CPC ............ H01L 43/08; H01L 29/66984; H01L 29/78606; H01L 29/12; H01L 29/66969
USPC ................... 257/29, 103, 421, 295, 491, 532, 257/E21.125, E29.323, E33.06, E21.665
See application file for complete search history.

(56) References Cited

U.S. PATENT DOCUMENTS

| 6,852,555 B1 | 2/2005 | Roman et al. |
| 2007/0082230 A1* | 4/2007 | Shi ......................... B82Y 10/00 428/811 |

(Continued)

FOREIGN PATENT DOCUMENTS

| WO | 02/35715 | 5/2002 |
| WO | 2006/022859 | 3/2006 |

OTHER PUBLICATIONS

Alves et al.: "Metallic conduction at organic charge-transfer interfaces", Nature Material, vol. 7, (2008), pp. 574-580.
(Continued)

*Primary Examiner* — Selim Ahmed
*Assistant Examiner* — Moin Rahman
(74) *Attorney, Agent, or Firm* — Nixon Peabody LLP; Khaled Shami (57) ABSTRACT

Method of filtering electrons to obtain spin-polarization of a current conducting at least 75% of electrons at the Fermi level, used with a spin-polarized current source comprising:
a polarized spin injection device comprising an electrically conducting substrate of which a first face has magnetic properties and an organic layer in contact with the first face of the substrate;
an electrically conducting material called the ground, the organic layer being arranged between the ground and the substrate;
a current source electrically connected to the first face of the substrate and the ground;
the method comprising circulation of the electron conduction current by means of the current source, between the first face of the substrate and the ground, at a temperature higher than −220° C.

13 Claims, 2 Drawing Sheets

(51) Int. Cl.
H01L 43/12 (2006.01)
H01F 10/00 (2006.01)
H01F 10/32 (2006.01)
H01F 41/32 (2006.01)
H01L 43/10 (2006.01)
H01F 1/00 (2006.01)

(56) References Cited

U.S. PATENT DOCUMENTS

2008/0152952 A1    6/2008    Santos et al.
2009/0011284 A1    1/2009    Wang et al.

OTHER PUBLICATIONS

Aristov et al., "Ferromagnetic cobalt and iron top contacts on an organic semiconductor: Evidence for a reacted interface", Organic Electronics 10, pp. 8-11 (2009).
Bergenti et al., "Transparent manganite films as hole injectors for organic light emitting diodes", Journal of Luminescence, Elsevier, 110, pp. 384-388 (2004).
Bonnel et al.: "Consequences of interfacial Fe—O bonding and disorder in epitaxial Fe/MgO/Fe(001) magnetic tunnel junctions", Physical Review B79, 224405 (2009), 10 pages.
Bowen et al, "Observation of Fowler-Nordheim hole tunneling across an electron tunnel junction due to total symmetry filtering", Physical Review B 73, 2006, 4 pages.
Bowen et al.: "Using half-metallic manganite interfaces to reveal insights into spintronics", J. Phys: Condens. Matter 19, 2007, pp. 315208 1 315208-27.
Carbone et al.: "Exchange Spilt Quantum Well States of a Noble Metal Film on a Magnetic Substrate", Physical Review Letters, vol. 71, No. 17, 1993, pp. 2805 2808.
Dedkov et al.: Graphene-protected iron layer on Ni(111), Applied Physics Letters 93, 2008, pp. 022509-1-022509-3.
Faure-Vincent et al.: "Interlayer Magnetic Coupling Interactions of Two Ferromagnetic Layers by Spin Polarized Tunneling", Physical Review Letters, vol. 89, No. 10, Sep. 2002, pp. 107206-1-107206-4.
Fert, "Origin, Development, and Future of Spintronics (Nobel Lecture)", Nobel Lectures 2008, Angew. Chem. Int. Ed., 2008, 47, pp. 5956-5967.
Gudat et al., "Spin Polarized Energy-Resolved Photoemission From Ni(111) Using Synchotron Radiation", Solid State Communications, vol. 37, pp. 771-775, 1981. (http://dx.doi.org/10.1016/0038-1098 (81) 91171-6.).
Hamman et al. "Ultrahigh vacuum deposition of organic molecules by electrospray ionization", Review of Scientific Instruments, 82, 033903, 2011, 7 pages; http://dx.doi.org/10.1063/1.3553010).
Huijben et al. "Structure-Property Relation of SrTiO3/LaAlO3 Interfaces", Advanced Materials, 2009, 21, pp. 1665-1677.
Katayama et al.: "Interlayer exchange coupling in Fe MgO Fe magnetic tunnel junctions", Applied Physics Letters 89, 112503, 2006, 3 pages.
Kawakami et al.: "Observation of the Quantum Well Interference in Magnetic Nanostructures by Photoemission", Physical Review Letters, vol. 80, No. 8, (1998) pp. 1754-1757.
Kurahashi et al. "Temperature dependence of the magnetization of Fe films on Cu (100) studied by SPMDS and SMOKE: effects of relaxation", Surface Science 552, 2004, pp. 193-198.

Lauhoff et al., "Origin of the Co uniaxial volume anisotropy of the fcc Co Ni Cu (001) System", Phys. Rev. B, vol. 60 No. 6, 1999, pp. 4087-4091.
Lee et al. "Effect of electrode composition on the tunnel magnetoresistance of pseudo spin valve magnetic tunnel junction with a MgO tunnel barrier", Appl. Phys. Lett. 9, 2007, pp. 212507-1-212507-3.
Methfessel et al.: "Spin scattering and spin polarized hybrid interface states at a metal organic interface", Physical Review B 84, 2011, pp. 224403 1 224403-7.
Milun et al.: "Quantum Well Structures in Thin Metal Films: Simple Model Physics in Reality", Rep. Progress in Physics, 65, 2002, pp. 99-141.
Niklasson et al. "Quantum-well-induced ferromagnetism in thin films", Physical Review B, vol. 56, No. 6, Aug. 1997, pp. 3276-3280.
Paggel et al.: "Quantum well photoemission from atomically uniform Ag Films: determination of electronic band structure and quasi-particle lifetime in Ag (100)", Applied Surface Science, vols. 162-163, Aug. 1, 2000, pp. 78-85.
Park et al.: "Tunnel spin polarization of Ni80Fe20/SiO2 probed with a magnetic tunnel transistor", Physical Review B73, 172402, 2006, 4 pages.
Qui et al., "Quantum well states and oscillatory magnetic interlayer coupling", J. of Physics: Condensed Matter 14, 2002, R169-R193.
Ruben et al.: "Grid-Type Metal Ion Architectures: Functional Metal-losupramolecular Arrays", Angew. Chem. Int. Ed. 2004, 43, pp. 3644-3662.
Santos et al., "Room-Temperature Tunnel Magnetoresistance and Spin-Polarized Tunneling through an Organic Semiconductor Barrier", Physical Review Letters, PRL 98, 016601 (2007).
Sanvito, "The rise of spinterface science", Nature Physics, vol. 6, 2010, pp. 562-564.
Schmaus et al.: "Giant magnetoresistance through a single molecule", Nature Nanotechnology, vol. 6, Mar. 2011, pp. 185-189.
Schneider et al. "Curie Temperature of Ultrathin Films of fcc Cobalt Epitaxially Grown on Atomically Flat Cu(100) Surfaces", Physical Review Letters, vol. 64, No. 9, Feb. 1990, pp. 1059-1063.
Wende et al.: "Substrate induced magnetic ordering and switching of iron porphyrin molecules", Nature Material, vol. 6, 2007, pp. 516-520.
Xiong et al.: "Giant magnetoresistance in organic spin-valves", Nature vol. 427, 2004, pp. 821-824.
International Search Report for Application No. PCT/EP2013/057769 dated May 10, 2013.
Barraud et al., "Unravelling the role of the interface for spin injection into organic semiconductors", Nature Physics, vol. 6, pp. 615-620 (Aug. 2010).
Javaid et al., "Impact on Interface Spin Polarization of Molecular Bonding to Metallic Surfaces", Physical Review Letters, PRL. 105, pp. 077201-1 to 077201-4 (Aug. 13, 2010).
Lach et al., "Metal-Organic Hybrid Interface States of a Ferromagnet/Organic Semiconductor Hybrid Junction as Basis for Engineering Spin Injection in Organic Spintronics", Advanced Function Materials, vol. 22, pp. 989-997 (2012).
Cinchetti et al., "Determination of spin injection and transport in a ferromagnet/organic semiconductor heterojunction by two-poton photoemission", Nature Materials, vol. 8, pp. 115-119 (Feb. 2009).
International Search Report for PCT/EP2013/057804 dated May 14, 2013.

* cited by examiner

SPIN-POLARISED CURRENT SOURCE

CROSS-REFERENCE TO RELATED PATENT APPLICATION

The present application is a National Stage Application of International Application No. PCT/EP2013/057804 entitled "SPIN-POLARISED CURRENT SOURCE" filed Apr. 15, 2013, which claims benefit of priority to French patent Application No. 12 53564 filed on Apr. 18, 2012. Both of these applications are incorporated herein by reference in their entirety.

TECHNICAL FIELD

This application relates to the technical field of electronics, and more precisely spintronics. The invention relates particularly to a device for filtering electrons passing through it, depending on the orientation of their spin, and a filtering method.

STATE OF PRIOR ART

Technological progress in the semiconductors industry has made it possible to very much reduce the dimensions of electronic devices, thus increasing their power and complexity. At the moment, manufacturing of these devices at the atomic scale is facing new difficulties, particularly related to physical phenomena that occur at this scale. Therefore, devices based on new concepts will have to be developed if semiconductor performances are to be further improved.

One of these concepts consists of making use of the quantum spin property of electrons' spin in order to store information. This technical field is called spintronics.

Electrons are characterised by several intrinsic values, particularly by their angular momentum or "spin". Due to the uncertainty principle of measurements at the atomic scale, the spin of an electron can only be measured along one observable or direction, and its value can be positive or negative. These states are referred to as "spin up" and "spin down" respectively.

Before this characteristic can be used industrially, devices must be developed capable of selecting and/or reading the spin-polarisation state of electrons. Devices for selecting or filtering electrons depending on the orientation of their spin are called spin injection devices. They are required to satisfy several of the following criteria before they can be used in industry:

1) it must be possible to select or filter more than 80% of electrons passing through the device depending on their spin-polarisation state;
2) and/or maintain this filtering rate at operating temperatures greater than or at least equal to the temperature of liquid nitrogen, of the order of −200° C., or preferably at operating temperatures of microelectronic devices, in other words within a temperature range of between −20° C. and 300° C.;
3) and/or be simple and economic to make;
4) and/or have nanometric dimensions;
5) and/or be capable of injecting filtered electrons depending on their spin orientation, into environments facilitating their propagation without changing said spin-polarisation state.

At the present time, several spin injection devices are under development. Some spin injectors make use of the tunnel effect to filter electrons. This effect is observed when a barrier called the tunnel barrier is inserted between two conducting elements. Physically, the tunnel barrier is a medium that is not very conducive to the diffusion of electrons. Therefore this medium may be insulating or semiconducting.

Since quantum properties such as for example the spin orientation of a particle move between two conductors by a tunnel effect, they are kept during this transport. This property can then be used to transport information between two ferromagnetic conducting elements. The polarisation state of electrons used to code information by means of orientation of the magnetisation of a ferromagnetic conducting element, can then be detected by modulating the relative orientation of the magnetisation of a second ferromagnetic conductor placed on the other side of the tunnel barrier, the complete assembly forming a magnetic tunnel junction. If the device is put into a parallel or anti-parallel magnetisation state of the two ferromagnetic layers, the degree of polarisation of the current spin passing through the device can thus be measured. Since the current starts from one electrode and travels towards the other, the current spin polarisation function and the polarisation detection or read function are assigned to each of the two magnetic tunnel junction interfaces depending on the sign of the current. The polarisation and spin detection assignments of the current can then be inverted at the interfaces simply by changing the sign of the current passing through the device [Fert, Nobel Lectures 2008].

The spin polarisation capabilities of a magnetic tunnel junction may be considerably increased by selecting a tunnel barrier with an electronic structure appropriate for that of adjacent ferromagnetic electrodes. In this case, some strongly spin-polarised conduction electron wave functions, within the ferromagnetic layer, will pass through the barrier more easily which results in a highly spin-polarised current (Bowen et al, Physical Review B 73, R140408 (2006)).

This effect has been observed for example by inserting a magnesium oxide layer between two iron alloy layers (Appl. Phys. Lett. 90, 212507 (2007)). Measurements at ambient temperature showed that the spin of 85% of electrons passing through interfaces of this type of device is polarised along a single direction, and with a single orientation. Unfortunately, this electron filtering mechanism significantly increases the electrical resistance of the device. At the submicronic scale, the resistance of the device is too high for significant use to be envisaged in the microelectronics industry. Therefore this type of device does not satisfy the fourth criterion given above.

The value of the resistance can be reduced if the tunnel barrier is replaced by semi-metallic materials which have the specific property of being metallic for electrons with their spin polarised along one direction and orientation, and being insulating for electrons with their spin polarised along a same direction but with the reverse orientation. This type of device can filter 95% to 99% of electron spins. Unfortunately, these measurements were only made at temperatures of the order of −260° C. (J. Phys: Condens. Matter 19, 315208 (2007)). Furthermore, these devices are difficult to make because of the composition and the complex structure of the semi-metallic layers.

Another line of development applies to the use of an organic layer as the tunnel barrier. Due to their low mass compared with inorganic materials, organic materials have the advantage that they interact only slightly with the polarisation state of conduction electrons. Thus, their spins are much less disturbed when they pass through mesoscopic thicknesses (10-1000 nm) of this type of material. However, spin-polarised charge carriers have to be successfully injected into these materials.

This is why recent research efforts focussed on spin polarisation of organic materials at the interface with a ferromagnetic metallic layer.

Recent work has demonstrated the strong potential of this type of interface as spin injection device, making use of a semi-metallic ferromagnetic alloy (*J. Phys: Condens. Matter* 19, 315208 (2007)). Once again, the most convincing results were obtained for temperatures less than −170° C. (Nature Physics 6, 615(2010)). One major disadvantage of this type of device is therefore that its filtering qualities are lost when the temperature increases. The filtering mechanisms involved are not well understood at the present time. The scientific community considers that this loss of filtering is due to extrinsic phenomena, amplified when the temperature of the device increases (Nature Physics 6, 562(2010)). Therefore operation in an industrial electronic environment is not viable. Theoretical work (Javaid et al, Physical Review Letters 105, 077201 (2010)) has predicted that the interface between a Co ferromagnetic layer and a Manganese Phthalocyanine molecular plane at zero temperature (T=−273.15° C.) could be spin-polarised, but even if the central manganese site (referred to as H2Pc) is removed, the efficiency of this polarisation would be too low (less than 60%) for competitive use in industry. The same observation can be produced from other theoretical and experimental results on properties of interfaces between Fe, Co or Cu phthalocyanines and Co or even Fe ferromagnetic metals [Physical Review B 84 224403 (2011); Advanced Functional Materials 22, 989 (2012)].

Finally, it should be noted that these high polarisation rates are only industrially interesting when they reflect the electrical conducting current under diffusive conditions, which by definition takes place at Fermi energy. There are other transport and spin depolarisation mechanisms at other energies that are not relevant for making a spin-polarised current source.

At the present time, no spin injection device can be qualified as satisfactory. One of the purposes of this application is to make another device preferably satisfying one or several of the above-mentioned criteria and to disclose a filtering method capable of polarising at least 75% of electrons in a diffusive electron conducting current at the Fermi level depending on the orientation of their spins.

PRESENTATION OF THE INVENTION

This application applies to a device for injecting polarised spins into an organic layer also called a polarised spin injector, on a spin-polarised current source and a versatile device as defined below. These devices satisfy one or several of the above criteria so that they can be used in the field of electronics or microelectronics.

A spin-polarised current source refers to a device capable of polarising spin moments of a majority of electrons passing through the device, along a single direction and with a single orientation. Therefore, a spin-polarised current source comprises a current source connected to a polarised spin injection device capable of filtering electrons from the current source depending on their spin.

A polarised spin injection device is proposed comprising:
  an electrically conducting material called a substrate, a first face of which has magnetic properties;
  an organic layer comprising a first face facing a second face, the first face at least partly comprising a set of atoms approximately in the same plane, and bonded to each other by atomic bonds parallel to or approximately parallel to the first face of the substrate.

This invention discloses a method of filtering electrons to obtain spin-polarisation of a current conducting at least 75% of electrons at the Fermi level, used with a spin-polarised current source comprising at least:
  a polarised spin injection device, said polarised spin injection device comprising at least one electrically conducting substrate of which a first face has magnetic properties and an organic layer comprising a first face, said first face of the organic layer at least partly comprising a set of atoms approximately in the same plane and bonded to each other by atomic bonds parallel to or approximately parallel to the first face of the substrate and being in contact with the first face of the substrate so as to form a filtering interface for the polarised spin injection device;
  an electrically conducting material called the ground, arranged facing the organic layer such that the organic layer is located between the ground and the substrate;
  a current source electrically connected to the first face of the substrate and the ground;
  the method comprising circulation of the electron conduction current by means of the current source, between the first face of the substrate and the ground, the spin-polarised current source being exposed to a temperature higher than −220° C.

The atoms in the first face of the organic layer may have a paramagnetic state, either alone or in combination (for example one or more dimers).

The atoms in the organic layer then form an interface called the filtering interface, in contact with the first face of the substrate.

The paramagnetic state of at least some of the atoms in the organic layer may also be induced by load transfer at the substrate/organic layer interface.

The spin (polarised) injection device, or the spin-polarised electron injection device is capable of filtering 75% or more than 75% and preferably more than 85% of conduction electrons derived from the substrate and passing through the filtering interface; depending on their spin polarisation state relative to the spin coordinate system implanted by the magnetism of the substrate, when its temperature is greater than −220° C., or −20° C., or 0° C. or 150° C. or 200° C.

Therefore, the disclosed filtering method can give a current of electrons at the Fermi level, more than 75% of which are spin-polarised.

The first face of the organic layer may be chemically adsorbed by the first face of the substrate. In this case, chemical bonds can be set up between atomic species forming the first face of the substrate and the first face of the organic layer. Advantageously, the chemical adsorption phenomenon can enable the organic layer to form a conducting extension to the substrate which is normally restricted to only the atoms in said substrate. The spin polarisation on organic sites will thus not be accompanied by an increase in the resistance of the device as is the case for Fe/MgO type tunnel junctions.

Molecular planes of said first faces in contact can be completed, to facilitate interactions between said first faces.

Chemical bonds between the first face of the substrate and the first face of the organic layer may be preferably characterised by magnetic molecular orbitals and particularly by paramagnetic molecular orbitals with a collective magnetic order, in other words a paramagnetic moment characterised by a single magnetic coordinate system fixed in space and time, overlain on the coordinate system of the substrate. In other words, the magnetism (diamagnetism and/or paramagnetism) of the first face of the organic layer combines with the magnetism (ferrimagnetism and/or ferromagnetism and/or antiferromagnetism) of the first face of the substrate. This coupling phenomenon is preferably caused by overlap of orbital bonds between the atoms forming said first faces.

At least two adjacent atoms at the first organic face (of the organic layer) can share a pi type bond, parallel or approximately parallel to the filtering interface, or an electron cluster parallel or approximately parallel to the filtering interface, forming a paramagnetic state. In other words, the lobes of the orbitals of two atoms adjacent to the first face of the organic layer forming a covalent bond, are parallel to each other and are perpendicular or approximately perpendicular to the first face of the substrate. The spatial extension of the density of states resulting from the pi bond (in other words the electron cluster resulting from the bond) is preferably parallel or approximately parallel to the first face of the substrate. This pi bond forms a paramagnetic state that can advantageously interact with the magnetic substrate. This interaction is advantageously increased due to the spatial offset of this electron cluster that is inherent to the nature of this pi bond parallel to the face of the substrate, along the direction of the atoms in the face of the substrate.

The first face of the substrate preferably has a magnetic order characterised by a long range order of magnetic moments of atoms (or a subset of atoms). A long range order is defined by a distance greater than the distances separating the first or the second or the third adjacent atoms surrounding an atom present in said first face.

The first face of the substrate may be at least partially or fully antiferromagnetic and may be characterised by a Néel temperature $T_N$ higher than the temperature of liquid nitrogen, for example higher than −220° C., or −20° C., or 0° C. or 150° C. or 300° C. This antiferromagnetic order may then be supported by sub-lattices of different species of atoms, each sub-lattice of species possibly being ordered ferromagnetically such that the filtering properties of the filtering interface are supported by at least one of these sub-lattices.

Preferably, the Néel temperature of the substrate is higher than the operating temperatures of the electronic devices.

The first face of the substrate may be at least partially or entirely ferromagnetic and may be characterised by a Curie temperature $T_C$ within the same ranges of values as the Néel temperatures mentioned above, and particularly higher than −220° C.

The first face of the substrate may be at least partially or entirely ferrimagnetic such that one of the spin sub-lattices supported by a sub-lattice of atomic sites forming the ferrimagnetic material, has ferromagnetic properties similar to those mentioned in the previous section, such that the filtering properties of the filtering interface are supported by one of these sub-lattices. In this case, the first face of the substrate may be characterised by a Curie temperature of more than −220° C.

The first face of the substrate may comprise one or several previous antiferromagnetic and/or ferromagnetic and/or ferrimagnetic regions.

The Néel temperature, like the Curie temperature, denotes the temperature above which a magnetic material becomes paramagnetic. Above this temperature, the thermal energy is sufficiently high to break the magnetic order of the first face of the substrate.

The first face of the substrate may be composed of or may comprise one or several metals or metal alloys composed of cobalt and/or nickel and/or iron and/or an iron alloy or a cobalt alloy with 4d and/or 5d type metals such as palladium and/or platinum, and/or one or several magnetic oxides such as $Fe_3O_4$ or $TiO_{(2-x)}$.

The organic layer covering the first face of the substrate may be composed of or it may comprise electrically insulating or semiconducting elements such as nitrogen or carbon or dimers of carbon and/or oxygen or phenanthroline.

According to one advantageous embodiment, the organic layer may comprise an amorphous carbon deposit. In particular, such an embodiment facilitates the subsequent fabrication of a metallic electrode on the organic layer comprising a well-defined and good quality interface due to the use of amorphous carbon in making the organic layer. Consider the example of a Co electrode that will be made on an organic layer of MnPc. Due to the low density of atoms typical of the atomic assembly forming the molecule of MnPc, deposition of Co on the MnPc can cause interdiffusion of Co atoms through the MnPc molecule (for example through pyrrole groups). This could degrade spin filtering properties of this Co interface deposited on MnPc (top interface). This difficulty can be overcome while maintaining properties inherent to the invention by depositing amorphous carbon on the MnPc after deposition of the molecular layer of MnPc and before deposition of the ferromagnetic metallic Co electrode. This amorphous carbon will fill in empty spaces in the first MnPc molecular surface plane(s) to provide a dense surface for the subsequent deposition of Co and enable the formation of an interface with a high spin filtering ratio.

It may be possible to address the magnetic properties of the first face of the substrate using a magnetic field or external current.

The first face and the second face of the organic layer may be parallel to or approximately parallel to each other and/or separated by a distance equal to a molecular plane or 1 nm.

A spin-polarised current source can be obtained from a previous device, when:
- an electrically conducting material called the ground is located above and facing the organic layer;
- the first face of the substrate and the face of the ground closest to the previous, called the first face of the ground, are electrically connected to a current source to enable a flux of conduction electrons to pass through the filtering interface.

Preferably, the ground or the first face of the ground may be at a sufficient distance from the substrate to not disturb atomic bonds that form or that have been formed between the substrate and the organic layer at the filtering interface. In other words, the first face of the ground may be at a distance from the filtering interface to limit or avoid overlap of wave functions describing atomic bonds, between the atoms making up the first face of the substrate and wave functions describing atomic bonds between atoms forming the first face of the ground. Two wave functions overlap when a portion of the spatial extension of each occupies the same space.

The electrical intensity applied between the first face of the substrate and the first face of the ground may preferably be less than the breakdown intensity or the disruptive intensity between said first faces. Thus, an electric voltage between the first face of the substrate and the ground can be less than a breakdown voltage between these two elements.

The second face of the organic layer and the first face of the ground may be separated by a distance greater than or equal to 1 nm.

The space between the second face of the organic layer and the first face of the ground can be filled in by a fluid, for example air or a neutral gas. This space may also be filled in by an electrically insulating or semiconducting material, preferably of the organic type such as tris(8-hydroxyquinoleine)aluminium(III)(Alq3), porphyrine, phthalocyanine (Pc), 5,6,11,12-tetraphenylnaphthacene (rubrene), dianhydride perylene-3,4,9,10-teetracarboxylique (PCTDA), tetracyanoethylene (TCNE), tetrathiafulvalene (TTF), tetracyanoquinodimethane (TCNQ), Fe-phenanthroline. This material could possibly be exactly the same nature as the organic layer.

A so-called versatile device is also disclosed comprising two previous polarised spin injection devices, their organic layers being bonded together by means of a layer called the intermediate layer.

According to one particular embodiment, the ground may correspond to a second electrically conducting substrate of a second polarised spin injection device, a first face of the second substrate possibly including magnetic properties, the second spin injection device possibly also comprising a second organic layer, the first face of which at least partly comprises a second set of atoms approximately in the same plane and bonded to each other by atomic bonds parallel to or approximately parallel to the first face of the second substrate and being in contact with the first face of the second substrate so as to form a filtering interface of the second polarised spin injection device, the organic layer and the second organic layer possibly being fixed to each other by means of an intermediate layer through which an electron conduction current can pass, the method also possibly comprising a step to measure or read the polarisation state of the electron conduction current by means of the second polarised spin injection device.

In this case, the first spin injection device can spin-polarise a flux (conduction current) of electrons derived from the Fermi level of the substrate of this device, passing through its filtering interface.

In this case, the second spin injection device can measure or read the polarisation state of this flux.

The intermediate layer may preferably be organic and its thickness may be:
  less than 3 nm in order to facilitate elastic tunnel transport of electrons between the two devices, preferably without disturbing or degrading the properties of the two filtering interfaces of the two devices, or
  greater than or equal to 3 nm to facilitate transport by "hopping" or diffusive effect.

The roles of the two spin injection devices, firstly the device that polarises spin (or write) and secondly the device that reads the spin polarisation state of the current, depend on the direction of the current passing through them. Thus, these roles may be inverted by changing the direction of current propagation in the versatile device. Thus, if the current originates from the substrate of the second device, then the first device will read the spin polarisation of the current originating from the second device.

The second device may be replaced by any electrical element for which the spin polarisation of the current passing through it is to be measured, by means of a first spin injection device, as long as this electrical element does not disturb the spin filtering function of the filtering interface of the first spin injection device.

An orientation of the magnetisation of the substrate may be determined such that at least 75% of the electrons through the polarised spin injection device filtering interface and perpendicular or approximately perpendicular to it, are polarised in a coordinate system defined relative to the orientation of the substrate magnetisation. This orientation of the substrate magnetisation can make a positive polarisation (spin up electrons) or a negative polarisation (spin down electrons).

A method of making a polarised spin injection device as described above is also disclosed, including the following steps:
  deposit an organic layer on a first face of a substrate with magnetic properties and preferably with a plane surface;
  position the ground facing the organic layer at a sufficient distance to not modify the magnetic properties of the substrate and the organic layer;
  electrically connect the first face of the substrate and the first face of the ground to a first electrode and a second electrode respectively of a single intensity source;
  align the magnetisation of the substrate to obtain the required direction and orientation of the current spin. This application also applies to a method of using a previous versatile device comprising the following steps:
  deposit an organic layer on a first face of a substrate with magnetic properties and preferably a plane surface;
  deposit the intermediate organic layer;
  deposit a second ferromagnetic layer on the second face of the organic layer;
  electrically connect the first face of the substrate and the second face of the second ferromagnetic layer to a first electrode and a second electrode respectively of a single intensity source;
  align the magnetisation orientations of the substrate and the second ferromagnetic layer so that relative parallel and anti-parallel alignments of the two layers can be made;
  measure the resistance and/or conductance and/or impedance of the versatile device in said parallel and antiparallel magnetisation alignment configurations of the substrate and of the second ferromagnetic layer.

This provides a mean of determining the spin polarisation of the current passing through the versatile device. The direction of the current can possibly be reversed in order to invert the write and read roles of the two interfaces of the versatile device.

A spin-polarised current source can be used in at least one step consisting of applying an electrical intensity through the current source between the first face of the substrate and the first face of the ground of the spin injection device, when the temperature of the spin injection device is higher than −220° C., or higher than −20° C., or 0° C. or 150° C. or 200° C. or 700° C.

When an electrical intensity is applied between the first face of the substrate and the first face of the ground, more than 75% and preferably more than 85% of electrons passing through the filtering interface are spin-polarised along a single direction and with the same orientation corresponding to the magnetisation direction of the substrate. This polarisation may be positive (spin up electrons) or negative (spin down electrons).

In other words, a spin-polarised current source may be used or made to function in environments in which electron devices operate.

The electrical intensity applied between the first face of the substrate and the first face of the ground can vary as a function of the distance separating these two first faces and elements placed between said faces, such that the intensity is less than the breakdown intensity between said faces.

BRIEF DESCRIPTION OF THE DRAWINGS

Other details and characteristics of the invention will become clear after reading the following description given with reference to the following appended figures. Identical, similar or equivalent parts of the different figures have the same references to facilitate comparison between one figure and the others. The different parts shown in the figures are not necessarily all at the same scale to make the figures more easily readable.

DETAILED PRESENTATION OF PARTICULAR EMBODIMENTS

We will now disclose several examples of polarised spin injection devices, spin-polarised intensity sources and versatile devices, and methods of making and using them.

One of the purposes of the invention is to propose a spin-polarised current source capable of polarising more than 75% and preferably more than 85% of electrons passing through the device, along the same direction and with the same orientation.

The operating temperature of the device is preferably within the range of working temperatures of microelectronic devices. These temperatures are usually between −20° C. and 150° C. More broadly, working temperatures of a spin-polarised current source may be at a non-null temperature, and especially for application reasons, higher than the temperature of liquid nitrogen (about −200° C.), or even higher than 200° C. for applications in extreme environments.

In other words, this application proposes a new spin-polarised current source comprising a polarised spin injection device that can be used industrially.

Figure 1:
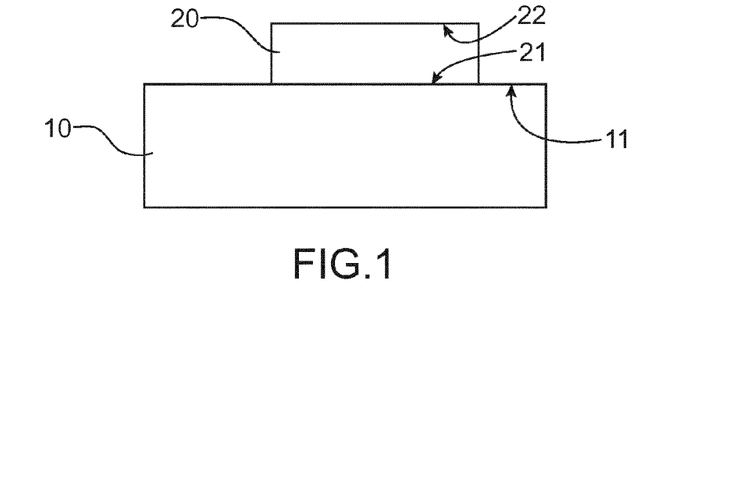
FIG. 1 shows a polarised spin injection device 1.

A polarised spin injection device 1 comprises a first electrically conducting material called the substrate 10, a first face 11 of which is in contact with the external environment and has ferromagnetic and/or ferrimagnetic and/or antiferromagnetic type magnetic properties (FIG. 1).

For example, the first face 11 of the substrate may comprise oxides and/or nitrides and/or carbides and/or comprise cobalt, and/or iron, and/or nickel, and/or an iron or cobalt alloy with 4d or 5d type materials (for example FePt and/or CoPd).

The first face of the substrate 10 is preferably crystallised according to a structure facilitating spin-polarised states on its surface, for an energy range between −1 eV<E-EF<+1 eV, and that can be electronically combined with the states of the organic layer 20 disclosed below.

When the first face of the substrate comprises cobalt, it may have a face-centred cubic (fcc) type crystalline structure, the orientation of the crystallographic planes being defined by the following Miller indices (001).

The first face 11 is at least partly covered by a layer of organic material 20. The layer of organic material is delimited by a first face 21 and a second face 22 facing the first face. The minimum distance between faces 21 and 22 of the organic layer corresponds to the spatial extension of the molecule making up the layer, along a direction perpendicular to the surface 21 of the organic layer. This distance may be twice this spatial extension.

The first face 21 is in contact with the first face 11 of the substrate 10, so as to form an interface called the filtering interface.

The first faces are adsorbed at this interface. The first face 11 of the substrate is plane to facilitate or optimise this adsorption phenomenon between the two faces 11 and 21.

Advantageously, the organic molecule forming the first face 21 is plane or approximately plane to facilitate its polarisation by the first face 11 of the substrate, and to facilitate the previous interactions between said first faces. The molecular plane of the first face is preferably complete for the same reason.

Atomic bonds between the atoms making the first face 21 of the organic layer are preferably parallel or approximately parallel to the first face 11 of the substrate.

The organic layer may be composed of carbon and/or nitrogen and/or oxygen and/or boron and/or hydrogen atoms. For example, an organic layer 20 may be a layer of the porphyrine families such as phthalocyanine ($Pc=C_{32}H_{18}N_8$). This layer may possibly be doped by metallic elements such as manganese (Mn).

Figure 2:
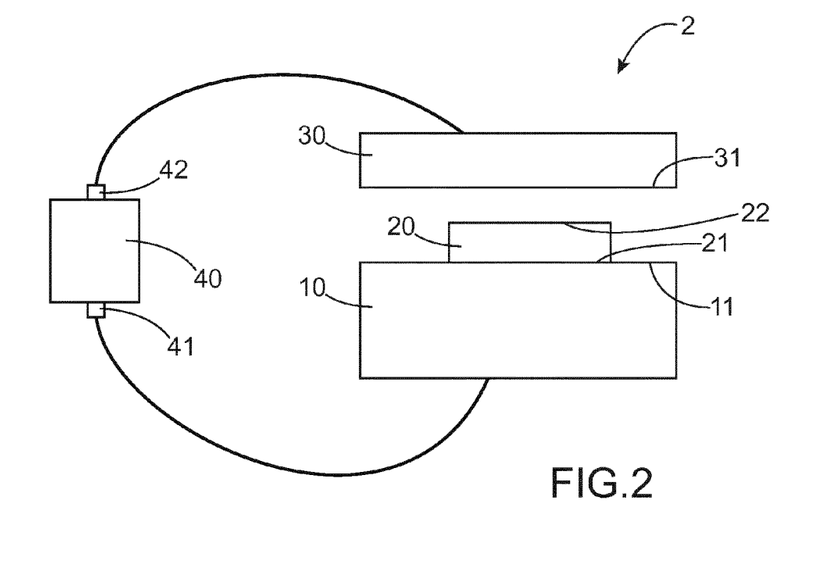
FIG. 2 shows a spin-polarised current source 2.

A spin-polarised source 2 can be obtained from one of the previous spin injection devices 1 (FIG. 2). This is done by having a second electrically conducting material 30 called the ground, facing the first face 11 of the substrate, the organic layer 20 being located between the ground and the substrate.

The ground 30 is preferably far enough from said first face 11 so as to not modify or influence the magnetic properties of the filtering interface. In other words, the ground is sufficiently far from the first face 11 of the substrate so that it does not disturb or prevent coupling of atomic bonds between said first face 11 and the atomic plane of the organic layer 20 in contact with the substrate 10.

For example, the distance separating the first face 31 from the ground 30, the face closest to and facing the first face 11 of the substrate, may be greater than or equal to 1 nm, or 3 nm, or 10 nm, or 100 nm or 1000 nm. Preferably, the first face 31 is a plane surface parallel to the first face of the substrate.

The substrate 10 and the ground 30 are connected to electrodes 41 and 42 respectively of a current source 40 such that when the current source is put into operation, an electric current or a flux of conduction electrons passes through the device, perpendicular or approximately perpendicular to the filtering interface (FIG. 2).

Figure 3:
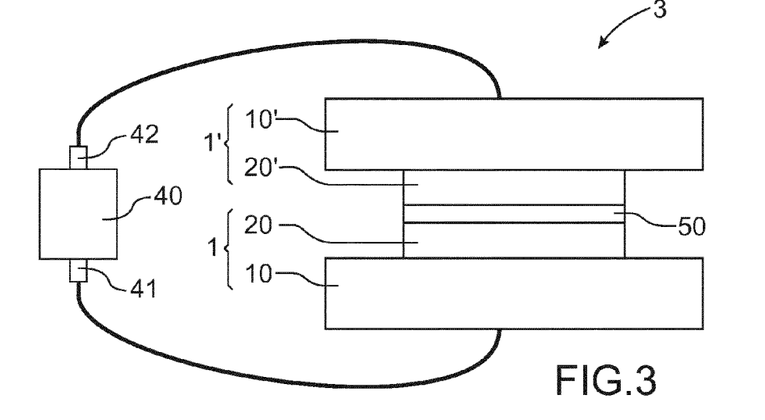
FIG. 3 shows a versatile device 4.

This application also applies to a device comprising two spin injection devices 1 and 1' as disclosed above. These devices are placed facing each other, or more precisely their organic layers (20, 20') are facing each other and are separated by an intermediate layer 50 (FIG. 3).

Such a device is called a versatile device 3 in this application, because it can equally well:

spin-polarise an electron flux passing through the first spin injection device 1;

and measure or read the polarisation state of this flux by means of the second spin injection device 1'.

The intermediate layer 50 can advantageously transmit an electron flux between the two devices 1 and 1', preferably having the least possible influence on the state of polarisation of electrons making up said flux. It may be organic in nature and its thickness defined along a direction perpendicular to one of the filtering interfaces may be:

A) less than 3 nm, in order to facilitate elastic tunnel transport of electrons between the two devices 1 and 1', or B) greater than or equal to 3 nm, to facilitate transport by "hopping" or by diffusive effect between said devices.

In case A), transport will be globally insensitive to structural defects in the organic layer. In case B), transport will be made over longer distances suitable for transport of information encoded by the spin of electrons making up the electric current.

The intermediate layer 50 may be composed of the materials mentioned above affecting the organic layer 20, and carbon nanotubes and graphene. Due to the weak band dispersion of the interface state enabling spin filtering, the electrical transport that takes place through the filtering interface and perpendicular or approximately perpendicular to it can then adopt a different propagation direction during transport through the material making up the intermediate layer 50, for example carbon nanotubes or graphene.

The spin polarisation state of the electron flux can be read by connecting the substrate 10 to a first terminal 41 of a current source 40; and the substrate 10' to a second terminal 42 of this current source 40. The resistance (or conductance or impedance) of the versatile device 3 can then be measured after setting up a parallel/anti-parallel orientation of the magnetisation of the two layers 10 and 10'.

If the current for which the spin polarisation is to be measured does not have a defined coordinate system (in other words a direction and an orientation), the resistance of the versatile device 3 will be measured while varying the orientation of the magnetisation of the ferromagnetic layer 10' acting as the read layer, in the three dimensions.

The application also relates to a method of making a spin injection device disclosed above, comprising at least one step for the deposition or formation of an organic layer 20 of phthalocyanine (Pc) on a cobalt substrate 10. The face 11 of the substrate may be crystallised, the crystallisation planes defining a face-centred cubic (fcc) type structure, for which the orientation is defined by the following Miller indices: (001).

The organic layer of phthalocyanine may be deposited in a vacuum chamber in which the pressure is less than $3 \times 10^{-8}$ mbars. The organic layer may be deposited using a sublimation or so-called "needle-valve" technique for which the molecules are introduced in the vapour phase at the face 11 of the substrate 10 using a nozzle (Review of Scientific Instruments, 82, 033903 (2011); http://dx.doi.org/10.1063/1.3553010).

The above method may be extended by the following steps to obtain a spin-polarised current source 2:
  position a mass 30 above and facing the organic layer 20, at a fixed distance from it;
  connect the substrate 10 to a first terminal 41 of a current source 40;
  connect the ground 30 to a second terminal 42 of this current source 40.

A versatile device 3 like that disclosed above can also be obtained from two spin injection devices using the following steps:
  assemble two previous spin injection devices 1 and 1' using an organic layer 50 placed between said devices;
  connect the substrate 10 to a first terminal 41 of a current source 40;
  connect the ground 30 to a second terminal 42 of this current source 40;
  align the magnetisation orientations of the two devices so as to be able to make parallel and anti-parallel relative alignments;
  measure the resistance of the versatile device along said magnetisation orientations, so as to measure or read the degree of polarisation of the current [A. Fert, Nobel Lectures ACS 2008].

We will now describe a method of using a spin-polarised current source 2 comprising a 0.3 nm thick layer of H2Pc deposited on a crystallised cobalt substrate (FCC, (001)). The polarised current source may be put into operation in an environment in which the temperature is higher than −20° C., or 0° C., or 50° C., or 100° C., or 200° C.

To achieve this, the current source 40 that is connected to the substrate 10 and to the ground 30 is switched on (FIG. 2). The applied voltage is chosen so that it is less than the voltage threshold that might produce an electric arc between the substrate and the ground, in other words an electric flashover. This voltage threshold depends on the distance separating these two elements, and the electrical properties of the element or elements present between the substrate and the ground.

The conduction electrons produced by the current source 40 and passing through the substrate/organic layer interface, are then filtered depending on the orientation of their spin. The spin of more than 75% and preferably more than 85% of the electrons passing through said interface or filtering interface is polarised along the same direction and with the same orientation.

This remarkable result was confirmed by spin-polarised photoemission measurements made from a measurement device called a Mott detector, coupled to an intense light source in the soft X-ray and ultraviolet range, originating from a synchrotron type light source [Solid State Communications 37, 771 (1981) http://dx.doi.org/10.1016/0038-1098 (81)91171-6].

The synchrotron light source has a strong light flux capable of detecting small quantities of material and particularly adjusting the photon energy at will so that the effective cross-section can be varied, in other words the detection sensitivity relative to the different elements present in the device. The chosen energies must remain low (<100 eV) in order to demonstrate characteristic spin-polarised structures with a low bond energy. In choosing a photon energy equal to 20 eV, preference is given to the detection of atoms (carbon, nitrogen) lighter in weight than cobalt. At 40 eV, heavier elements and magnetic metals are more easily detected.

This energy source is directed on the sample including the filtering interface, located at the boundary between the organic layer 20 and the cobalt layer 10 (FIG. 1). Measurements are made at ambient temperature, namely about 25° C. A Mott type detector measures the spin polarisation of photoelectrons emitted by said filtering interface. This detector has an effective Sherman factor equal to 0.15 (factor determining the spin sensitivity of this type of detector). This limitation reflects the physical measurement method (the spin orbit interaction induces asymmetry of the probability of left/right back scattering of spin-polarised electrons at high energy on heavy atoms. This diffusion process is called "Mott diffusion").

The photoemission intensity for each spin channel is then measured on a substrate 10 and organic layer 20 assembly as a function of their bond energy, in other words relative to the Fermi level of the interface 21. This intensity is measured separately for each spin channel and in bond energy for the substrate 10 alone. By subtracting the intensity from the substrate 10 only from the intensity of the substrate 10 and organic layer 20 assembly for each spin channel (the subtraction takes account of the attenuation of photoelectrons derived from the substrate 10 through the organic layer 20), the dependence of the photoemission intensity from the interface 21 alone composed of the electrons forming the chemical bonds between the first face 11 of the substrate 10 and the first face 21 of the organic layer 20 can then be obtained as a function of the bond energy. This dependence is shown in FIG. 4.

Figure 4:
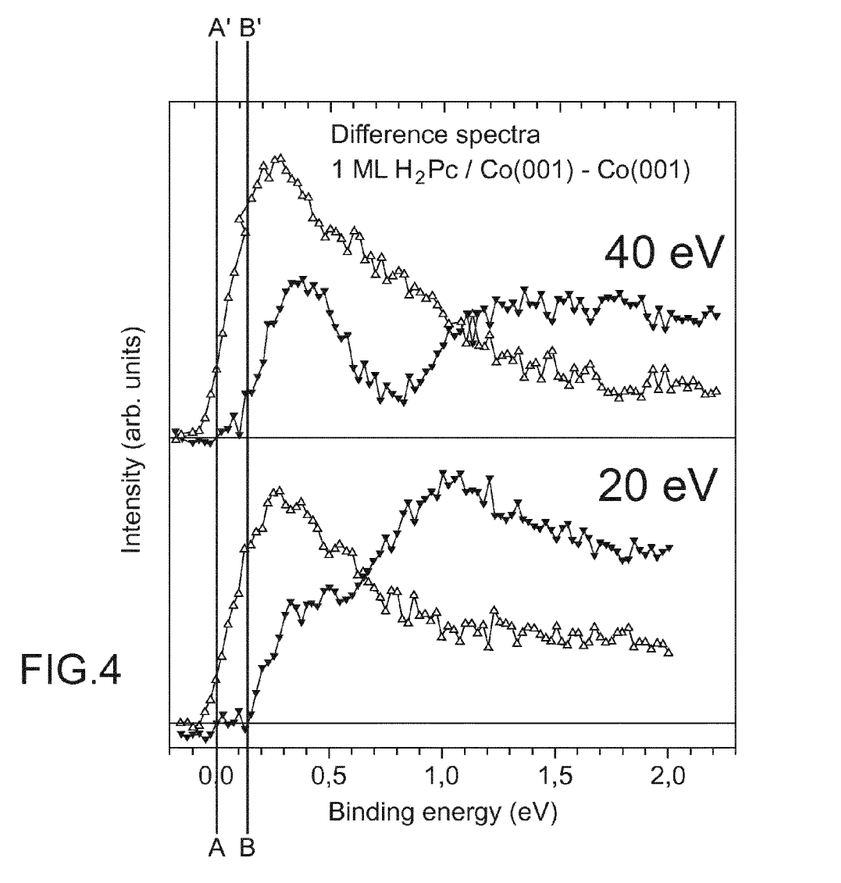
FIG. 4 shows measurements made at a temperature of 25° C., by spin-polarised photoemission close the Fermi level, at the interface between an organic layer and a magnetic layer present in devices 1 and 2 and 3.

Surprisingly, these measurements show that more than 80% of electrons bonded to atoms present at the filtering interface with energy close to or equal to the Fermi level (corresponding to the value 0 on the abscissas of graphs shown in FIG. 4), have the same spin polarisation state. Only spin up type polarised electrons are detected for a relative energy equal to zero (AA'), (FIG. 4). Conversely, for the same relative energy, spin down type polarised electrons symbolised by solid triangles are not detected. For probe photons with 20 eV energy, their signal only becomes measurable starting from a relative energy of more than $E-E_F^- = +0.13$ eV (BB') (FIG. 4). This detection threshold remains essentially unchanged for 40 eV photons. Taking account of systematic errors related to the detection equipment, we estimate that in more than 80% cases, the result translates a spin polarisation close to or at the Fermi level.

But the electrical conductivity of a material depends directly on the number of electrons present at the Fermi energy level. Consequently, by passing through the filtering interface, the conductivity perceived by conduction electrons will differ depending on whether or not their spin polarisation is identical to the polarisation state of the largest population of electrons at the Fermi energy level. In other words, conduction electrons can propagate through the filtering interface along two channels with different resistivities. The resistivity is inversely proportional to the number of electrons with the same spin polarisation state at the Fermi energy level. The spin filtering quality of conduction electrons depends on the difference in the resistivity between these two channels. These measurements show that a spin injection device formed by an $H_2Pc$ layer on a crystallised cobalt layer can obtain a filtering interface comprising more than 80% of electrons at the Fermi level with the same polarisation state (FIG. 4). Therefore this interface forms an industrially useable polarised spin injector.

In other words, an industrially useable polarised spin injector can be formed from an organic layer in contact with a layer with magnetic properties. To achieve this, it is preferable if:
a) the electrons in the atoms making up the layer 10 with magnetic properties that is in contact with the organic layer 20 are at the Fermi level or are within the $-1$ eV<$E-E_F$<$+1$ eV range and are polarised and magnetically ordered;
b) atoms in the organic layer have a paramagnetic order that can be obtained by pi bonds between the atoms or by any bond allowing spatial overlap with the same energy of these orbitals as those of the surface atoms of substrate 10.

By hybridisation of the molecule following its adsorption on the surface of the substrate 10, the paramagnetic state of atoms in the molecule forming the organic layer is then magnetically ordered.

Up to now, comparative filtering values (of the order of 80%) could only be observed with organic devices operating in temperature ranges below $-220°$ C. Therefore, such devices cannot be used in the microelectronics field.

The scientific community now accepts that the filtering ratio for a polarised spin injection device comprising a ferromagnetic materials/organic materials interface, might originate from the presence of structural defects at the interface (Nature Phys. 6, 615 (2010)). But this filtering mechanism degrades with temperature. Consequently, it is considered to be impossible to obtain filtering ratios of more than 80% for such devices operating at temperatures higher than $-220°$ C.

Recent modelling work has demonstrated that the state density of the first atomic layer of a Pc layer doped with manganese ions and deposited on a cobalt substrate is such that only 25% of electrons passing through the filtering interface can be polarised (Physical Review Letters, 105, 077201 (2010)). This work also suggests that modification of the central site can modify the spin polarisation. These calculations were made assuming that the device is operating at a theoretical temperature of absolute zero, or about $-273.15°$ C.! Obviously, these results cannot be transposed to real devices because these conditions are unachievable. In other words, this work does not invalidate the assumptions and observations demonstrating degradation of the quality of polarised spin filtering when the temperature of the device increases (Nature Phys. 6, 615 (2010), Nature Physics 6, 562 (2010)).

It has also been observed that the performance of ferromagnetic materials is directly dependent on the chemical order of atoms making up the alloy, in this case on real devices comprising a ferromagnetic materials/organic materials interface. This order is very difficult to obtain experimentally, and is equally difficult industrially. The theoretical model disclosed above does not take account of this manufacturing difficulty.

Furthermore, this theoretical model is not viable for describing spin filtering properties of this type of interface because it does not take account of interdiffusion phenomena that occur between the layers during their production, phenomenon known as being destructive of the spintronic properties of an interface.

Other experimental and theoretical results also suggest that the central site of the Pc molecule can influence the spin polarisation at the interface with a ferromagnetic material [Physical Review B 84 224403 (2011); Advanced Functional Materials 22, 989 (2012)]. However, this work does not suggest that this type of interface can be used to obtain a sufficiently strong spin polarisation for use industrially and competitively. Furthermore, the authors of [Advanced Functional Materials 22, 989 (2012)] suggest that changing from a perpendicular bond (FePc, CoPc) to a planar bond (CuPc) emanating from the Co substrate could (taking account of the poor signal/noise ratio of experimental results) increase the spin polarisation (from practically 0% to ~30%) but without making it industrially competitive. Finally, the interface between Fe cc(001) and CuPc would replicate the spin polarisation (~40%) of the subjacent Fe [Physical Review B 84 224403 (2011)] without the appearance of any interface states. The inventors believe that the uncertain nature of these various results reflects the sensitivity of the experimental techniques used and also the quality/inventiveness of the analysis of results obtained.

Surprisingly and unlike what has generally been accepted by the scientific community up to now, the inventors were the first to obtain an industrially useable spin injection device particularly with a very high spin polarisation (more than 80%), by depositing a layer of $H_2Pc$ on a cobalt layer.

More precisely, an organic H2Pc layer was deposited on a ferromagnetic Co layer covering a crystallised Cu substrate (001).

Even more precisely, the experiment was repeated with the same results for other approximately two-dimensional molecules (MnPc, pi bonded carbon atoms) and three-dimensional molecules of Fe-phenanthroline, in which a subset of atoms have bonds parallel or approximately parallel to the surface 11 of the substrate. The results given above show that the filtering properties of this type of interface are:
intrinsic to the device;
essentially independent of the central site within the phthalocyanine cage;
dependent on the polarisation of perpendicular or approximately perpendicular electronic orbitals that bond the atoms in the organic layer to the atoms making up the magnetic layer.

This shows that it is preferable that linear combinations of molecular orbitals that adsorb the organic layer on the magnetic substrate are combinations of a paramagnetic state that will be more easily coupled to the magnetism of the substrate. To achieve this, the magnetic layer preferably comprises at least one ferromagnetic and/or antiferromagnetic and/or ferrimagnetic region in contact with the organic layer.

In other words, the state density of two atoms on the first face 21 of the organic layer 20 sharing a pi bond and adsorbed on the substrate 10 will be at the Fermi level and they will be strongly spin-polarised as long as the magnetic properties of the first face of the substrate are kept. The spin filtering properties of such a device will be constant as long as the thermal energy is insufficient to break the magnetic order of the first face of the substrate.

Consequently, the filtering properties of a spin injection device as disclosed above can be kept at temperatures greater than −220° C., or −20° C. or 0° C., or 150° C., or 200° C., as long as the first face 11 of the substrate 10 keeps its magnetic properties within the previous temperature range. Therefore the first face 11 of the substrate is chosen such that its Néel or Curie temperature is higher or much higher than the operating temperatures of the device.

For example, a cobalt layer with at least 3 monolayers (namely about 0.5 nm thick) sandwiched between a copper substrate and a previous organic layer, forms a filtering interface (>75%) operating at temperatures up to the order of 230° C. This interface can thus polarise the current from the cobalt layer, or enable detection of the spin polarisation of a current towards the cobalt layer. In the framework of a versatile device, this interface can read the amplitude of the polarised current originating from an electrical device placed on it and in the direction of the cobalt layer, provided that this device does not degrade the filtering properties of the interface (see the considerations mentioned above).

According to another implementation, a versatile device may be composed of a stack made on Si (001), Cu (70 nm)/Ni (5 nm), and then a ferromagnetic layer 10 of cobalt fcc (001) at least 0.5 nm thick [Phys. Rev. B 60 4087 (1999)], on which the 0.3 nm thick $H_2Pc$ organic interface layer 20 is deposited, followed by the 2.4 nm thick $H_2Pc$ intermediate organic layer 50, then the 0.3 nm thick $H_2Pc$ interface layer 20' and then the 100 nm thick cobalt ferromagnetic layer 10', possibly magnetically hardened with 2.5 nm thick CoO and possibly protected by a layer of gold. The quality of the upper filtering interface can be improved by making the cobalt deposit cold (T=−220° C.). The spin filtering at the two interfaces generates a relative difference of more than 300% in the resistance of the versatile device for the two parallel and anti-parallel orientations of relative magnetisation of ferromagnetic layers (for a spin polarisation of more than 80% of each of the two interfaces without any other spin filtering due to transmission through the organic barrier), up to temperatures of the order of 230° C., this temperature being limited by the structural stability of the metallic stack before the ferromagnetic substrate 10.

The following table gives some examples of materials for polarised spin injection devices capable of achieving an electron filtering ratio greater than or equal to about 85% as a function of their spin orientation, in other words obtaining a current of spin-polarised electrons at the Fermi level with a ratio greater than or equal to 85%:

| Substrate 10 | Organic layer 20 |
| --- | --- |
| Co fcc(001) | MnPc |
| Co fcc(001) | $H_2Pc$ |
| Co fcc(001) | Phenantroline |
| Co fcc(001) | Amorphous carbon |

Finally, this application provides a means of fabricating and using a polarised spin injection device and a spin-polarised current source device that can be used industrially because it respects at least one of the following criteria:
1) the filtering interface of the device provides a means of selecting or filtering more than 75%, preferably more than 85% of conducting electrons passing through it as a function of their spin following the coordinate system imprinted by the subjacent magnetic substrate;
2) this polarised spin filtering ratio can be kept as long the Curie or the Néel temperature of the first face of the substrate is higher than the operating temperatures of the device;
3) magnetic materials and organic materials used to form the device are abundant or can easily be synthesised and are easy to be assembled using techniques currently used in the electronics industry;
4) these fabrication techniques can also be used to make devices with low resistance, particularly when they are created with nanometric dimensions because the organic layer adsorbed on the metallic substrate becomes metallic itself; consequently the spin injection device, like the spin-polarised current source, can be considered electrically like a pure resistive conductor;
5) the spin injection device and the spin-polarised current source can inject conduction electrons over long distances in organic materials without their spin polarisation state being modified; due to their use of an organic layer, these two devices are particularly suitable for the injection of polarised spins in organic semiconductors.

The invention claimed is:

1. A method of filtering electrons to obtain spin-polarisation of an electron conduction current at the Fermi level of at least 75%, used with a spin-polarised current source, comprising at least:
 a polarised spin injection device comprising at least one electrically conducting substrate of which a first face has magnetic properties and an organic layer comprising a first face, said first face of the organic layer at least partly comprising a set of atoms approximately in the same plane and bonded to each other by atomic bonds parallel to or approximately parallel to the first face of the substrate and being in contact with the first face of the substrate so as to form a filtering interface for the polarised spin injection device;
 an electrically conducting material for ground, arranged facing the organic layer such that the organic layer is located between the ground and the substrate;
 a current source electrically connected to the first face of the substrate and the ground;
 the method comprising circulation of the electron conduction current by means of the current source, between the first face of the substrate and the ground, the spin-polarised current source being exposed to a temperature higher than −220° C.

2. The filtering method according to claim 1, in which the first face of the organic layer is chemically adsorbed by the first face of the substrate.

3. The filtering method according to claim 1, in which chemical bonds between the first face of the substrate and the first face of the organic layer are characterised by paramagnetic molecular orbitals with a collective magnetic order.

4. The filtering method according to claim 1, in which at least two adjacent atoms at the first face of the organic layer share a pi type bond, or electron cluster parallel or approximately parallel to the filtering interface forming a paramagnetic state.

5. The filtering method according to claim 1, in which the first face of the substrate is at least partially antiferromagnetic and has a Néel temperature higher than −220° C.

6. The filtering method according to claim 1, in which the first face of the substrate is at least partially ferromagnetic or ferrimagnetic, and has a Curie temperature higher than −220° C.

7. The filtering method according to claim 1, in which the first face of the substrate comprises at least one of the following elements: cobalt, nickel, iron, an iron or cobalt alloy with 4d and/or 5d type metals, one or several magnetic oxides.

8. The filtering method according to claim 1, in which the organic layer comprises electrically insulating or semiconducting elements, of carbon or dimers of carbon and/or oxygen type, or phenanthroline.

9. The filtering method according to claim 1, in which the ground is at a sufficient distance from the substrate to not disturb atomic bonds formed between the substrate and the organic layer at the filtering interface.

10. The filtering method according to claim 1, in which a space between a second face of the organic layer, facing the first face of the organic layer, and the ground is filled in by an organic material comprising at least one of the following elements: Alq3, Pc, rubrene, PCTDA, TCNE, TTF, TCNQ.

11. The filtering method according to claim 1, in which the ground corresponds to a second electrically conducting substrate of a second polarised spin injection device, a first face of the second substrate including magnetic properties, the second spin injection device also comprising a second organic layer the first face of which at least partly comprises a second set of atoms approximately in the same plane and bonded to each other by atomic bonds parallel to or approximately parallel to the first face of the second substrate and being in contact with the first face of the second substrate so as to form a filtering interface of the second polarised spin injection device, the organic layer and the second organic layer being fixed to each other by means of an intermediate layer through which an electron conduction current can pass, the method also comprising a step to measure or read the polarisation state of the electron conduction current by means of the second polarised spin injection device.

12. The filtering method according to claim 1, in which an electrical voltage between the first face of the substrate and the ground is less than a breakdown voltage between these two elements.

13. The filtering method according to claim 1, in which an orientation of the magnetisation of the substrate is determined such that at least 75% of the electrons passing through the polarised spin injection device filtering interface and perpendicular or approximately perpendicular to it are polarised in a coordinate system defined relative to the orientation of the substrate magnetisation.

* * * * *